(12) United States Patent
Gebhardt et al.

(10) Patent No.: US 8,547,097 B2
(45) Date of Patent: Oct. 1, 2013

(54) SAR CALCULATION FOR MULTICHANNEL MR TRANSMISSION SYSTEMS

(75) Inventors: Matthias Gebhardt, Erlangen (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 631 days.

(21) Appl. No.: 12/823,177

(22) Filed: Jun. 25, 2010

(65) Prior Publication Data

US 2010/0327868 A1 Dec. 30, 2010

(30) Foreign Application Priority Data

Jun. 26, 2009 (DE) .......................... 10 2009 030 721

(51) Int. Cl.
*G01V 3/00* (2006.01)
*G01R 33/48* (2006.01)

(52) U.S. Cl.
USPC ........... 324/307; 324/309; 324/318; 324/322; 600/410

(58) Field of Classification Search
USPC ........................... 324/300–322; 600/407–464
See application file for complete search history.

(56) References Cited

U.S. PATENT DOCUMENTS

| | | | |
|---|---|---|---|
| 3,278,899 A * | 10/1966 | Shelton, Jr. et al. | 382/278 |
| 6,759,847 B2 * | 7/2004 | Brinker et al. | 324/309 |
| 7,598,737 B2 | 10/2009 | Campagna | |
| 8,148,985 B2 * | 4/2012 | Zelinski et al. | 324/309 |
| 2007/0108976 A1 | 5/2007 | Morich et al. | |
| 2008/0265889 A1 | 10/2008 | Zhai et al. | |
| 2009/0146660 A1 | 6/2009 | Schnell et al. | |
| 2010/0308825 A1 * | 12/2010 | Brinker et al. | 324/309 |
| 2011/0043205 A1 * | 2/2011 | Graesslin et al. | 324/307 |
| 2012/0013337 A1 * | 1/2012 | Graesslin et al. | 324/309 |

OTHER PUBLICATIONS

"Parallel Excitation With an Array of Transmit Coils,"Zhu, Magnetic Resonance in Medicine, vol. 51 (2004) pp. 775-784.
"Time-Optimal Design for Multidimensional and Parallel Selective Excitation," Lee et al., Magnetic Resonance Medicine, vol. 61 (2009) pp. 1471-1479.
"Simultaneous $B^+_1$ Homogenization and Specific Absorption Rate Hotspot Suppression Using a Magnetic Resonance Phased Array Transmit Coil," Van den Berg et al., Magnetic Resonance in Medicine, vol. 57 (2007) pp. 577-586.

* cited by examiner

*Primary Examiner* — Melissa Koval
*Assistant Examiner* — Emily Chan
(74) *Attorney, Agent, or Firm* — Schiff Hardin LLP (57) ABSTRACT

In a device and a method to determine SAR for a magnetic resonance tomography transmission system with multiple antenna elements, a single-column cross-correlation matrix of an antenna element matrix of antenna element values of multiple antenna elements of the magnetic resonance tomography transmission system is determined for each of multiple points in time or time periods. These single-column cross-correlation matrices are added into a sum cross-correlation matrix over a summation time period and the sum cross-correlation matrix is multiplied with a hotspot sensitivity matrix. The hotspot sensitivity matrix represents the sensitivities in at least one direction at a number of hotspot points in a subject located in the magnetic resonance tomography transmission system. The product of the sum cross-correlation matrix and the hotspot sensitivity matrix is multiplied with a value representing the dielectricity at least one hotspot point in order to determine a respective SAR value for hotspot points. If at least one SAR value exceeds a predetermined upper limit, the voltage applied to at least one antenna element or the current flowing in at least one antenna element is reduced or deactivated.

38 Claims, 8 Drawing Sheets

$$\bar{T} = \begin{pmatrix} \begin{array}{ll} U1U1 & U5U1 \\ U1U2 & U5U2 \\ U1U3 & U5U3 \\ U1U4 & U5U4 \\ U1U5 & U5U5 \\ U1U6 & U5U6 \\ U2U7 & U5U7 \\ U2U8 & U5U8 \\ U2U1 & U6U1 \\ U2U2 & U6U2 \\ U2U3 & U6U3 \\ U2U4 & U6U4 \\ U2U5 & U6U5 \\ U2U6 & U6U6 \\ U2U7 & U6U7 \\ U2U8 & U6U8 \\ U3U1 & U7U1 \\ U3U2 & U7U2 \\ U3U3 & U7U3 \\ U3U4 & U7U4 \\ U3U5 & U7U5 \\ U3U6 & U7U6 \\ U3U7 & U7U7 \\ U3U8 & U7U8 \\ U4U1 & U8U1 \\ U4U2 & U8U2 \\ U4U3 & U8U3 \\ U4U4 & U8U4 \\ U4U5 & U8U5 \\ U4U6 & U8U6 \\ U4U7 & U8U7 \\ U4U8 & U8U8 \end{array} \end{pmatrix}$$

SAR CALCULATION FOR MULTICHANNEL MR TRANSMISSION SYSTEMS

BACKGROUND OF THE INVENTION

1. Field of the Invention

The invention concerns methods and devices for a SAR monitoring for a magnetic resonance tomography apparatus.

2. Description of the Prior Art

Magnetic resonance tomography apparatuses are known from DE 10 2005 052 564, for example.

In the case of operation of MR scanners with a transmission (TX) array and with the generation of RF pulses that can exhibit an arbitrary pulse shape for each array element (variation of amplitude and phase), a multitude of possibilities results for overlaying the electrical fields in the body of the examination subject. A high level of complexity exists if the local SAR should be comprehensively monitored or calculated in advance for parallel pulses (simultaneously emitted pulses). Monitoring of the local SAR value, however, is absolutely necessary for the safety of the patient and is required by corresponding regulations. The overlaying of the electrical fields in array antennas is particularly critical because the E-vectors (electrical field vectors) add linearly but the local power that is released (applied) by a pulse is proportional to $E^2$.

However, because the local SAR is not directly measurable, it is necessary to rely on generating suitable body models representing the (complex) conductivity distribution and calculating in these models the fields that are produced by the respective array elements and the model points of the model. At present such calculations are commonly implemented using a technique known as the FDTD (Finite Differential Time Domain) method.

For a typical body mode, these calculations presently require multiple hours and may possibly be accelerated by the use of special processors. An element of the sensitivity matrix Skl with the property Ekl=Skl*Ik arises for each TX array element k and every model point in the body model l as a result of the FDTD calculation.

In order to be able to calculate the local heat generation at specific model points for a particular point in time, the fields of the individual antennas are added for the parallel transmission pulses that occur at this point in time, and then the released electrical power density is calculated. In the case of isotropic conductivity σ, this is the term Re(σE*E). In the case of anisotropic conductivity, a conductivity tensor occurs at the point of the scalar σ.

The heat released at a specific time interval then results as the time integral of these powers. If this is calculated as a discrete sum, it must be taken into account that the amplitudes and phases of the individual currents can change significantly for known parallel transmission pulses within 10 ms, and therefore the sampling points in time must lie correspondingly close together. Generally, discrete RF pulses are repeated multiple times in each phase sequence for MR imaging; the SAR values accumulated over time then result as a summation across the SAR contributions of the individual pulses.

If it is sought to monitor the model precisely in its entirety, such a calculation would have to be conducted at every model point. The procedure seeks to combine adjacent model points with similar conductivities, but the problem remains that, due to the multiple overlaying possibilities of respective amplitudes and phases of the Nchannels (Nchannels can typically be 8), there is generally not a single "hotspot" in the body at which the electrical power density is always greatest. Under the circumstances it is consequently necessary to incorporate a number of positions to determine the local SAR.

An analogous problem is posed with regard to the global power loss if the total energy that is deposited in the patient volume is to be calculated from the time-dependent vector of the antenna voltages and a previously measured conductance matrix or, respectively, scatter matrix of the system.

From ISMRM 2008, Abstract #74, Graesslin et. al., an approach is known to calculate the electrical power densities online for numerous model points on the basis of sensitivity matrices calculated in advance, with the aid of fast parallel processors. An approach for parallel excitation with an array of transmission coils is known from Zhu, "Parallel Excitation With an Array of Transmit Coils", MRM 51:775-784 (2004).

SUMMARY OF THE INVENTION

An object of the invention is to optimize the SAR monitoring.

According to the invention, in a method to determine SAR for a magnetic resonance tomography transmission system with multiple antenna elements, a (1*64) cross-correlation matrix is determined for each of multiple points in time or time periods that contains as elements (all) products of a respective antenna element value of multiple antenna elements of the magnetic resonance tomography transmission system, with a respective (the same or additional) antenna element value (for all antenna elements, thus the same antenna element or a different antenna element).

These single-column (1*64) cross-correlation matrices are added into a sum cross-correlation matrix over a summation time period. The sum cross-correlation matrix is multiplied with a hotspot sensitivity matrix, in which elements of the hotspot sensitivity matrix respectively represent sensitivities in at least one direction at a number of hotspot points in a subject located in the magnetic resonance tomography transmission system.

The product of the sum cross-correlation matrix and the hotspot sensitivity matrix is multiplied with a value representing the dielectricity (s) at least one hotspot point in order to determine an SAR value for each hotspot points.

If at least one determined SAR value exceeds a predetermined upper limit, the voltage applied to at least one antenna element or the current flowing in at least one antenna element is reduced or deactivated.

As used herein, a "cross-correlation matrix" means a correlation of channels for the same (one) time interval.

The invention also encompasses a device for SAR determination for a magnetic resonance tomography transmission system that implements the above-described method.

The "spatial" field calculation and the temporal summation can thus be implemented with this method without being coupled to one another.

The following advantageous embodiments of the invention result.

The method results in a look-ahead calculation for complete pulses and the sequences in which they are repeatedly sent: the cross-correlation matrix is summed for a complete transmission pulse and subsequently evaluated via multiplication with the sensitivity matrices. This enables an efficient, accelerated calculation.

An online monitor (running monitoring): for an online monitoring the local SAR is calculated continuously (for example for the TX array system given TX arrays) for time intervals following one another in close succession (on the order of one second), and is evaluated at the interval end with the use of the sensitivity matrix, and the results for the locally released amounts of heat are supplied to a continuous, concurrently running monitoring process. This monitoring process automatically causes remedial action to occur upon exceeding fixed SAR limit values for different time intervals. Such a monitoring could function alone using the controller of the transmitter, without prior knowledge of the precalculated pulses.

DESCRIPTION OF THE PREFERRED EMBODIMENTS

Figure 1:
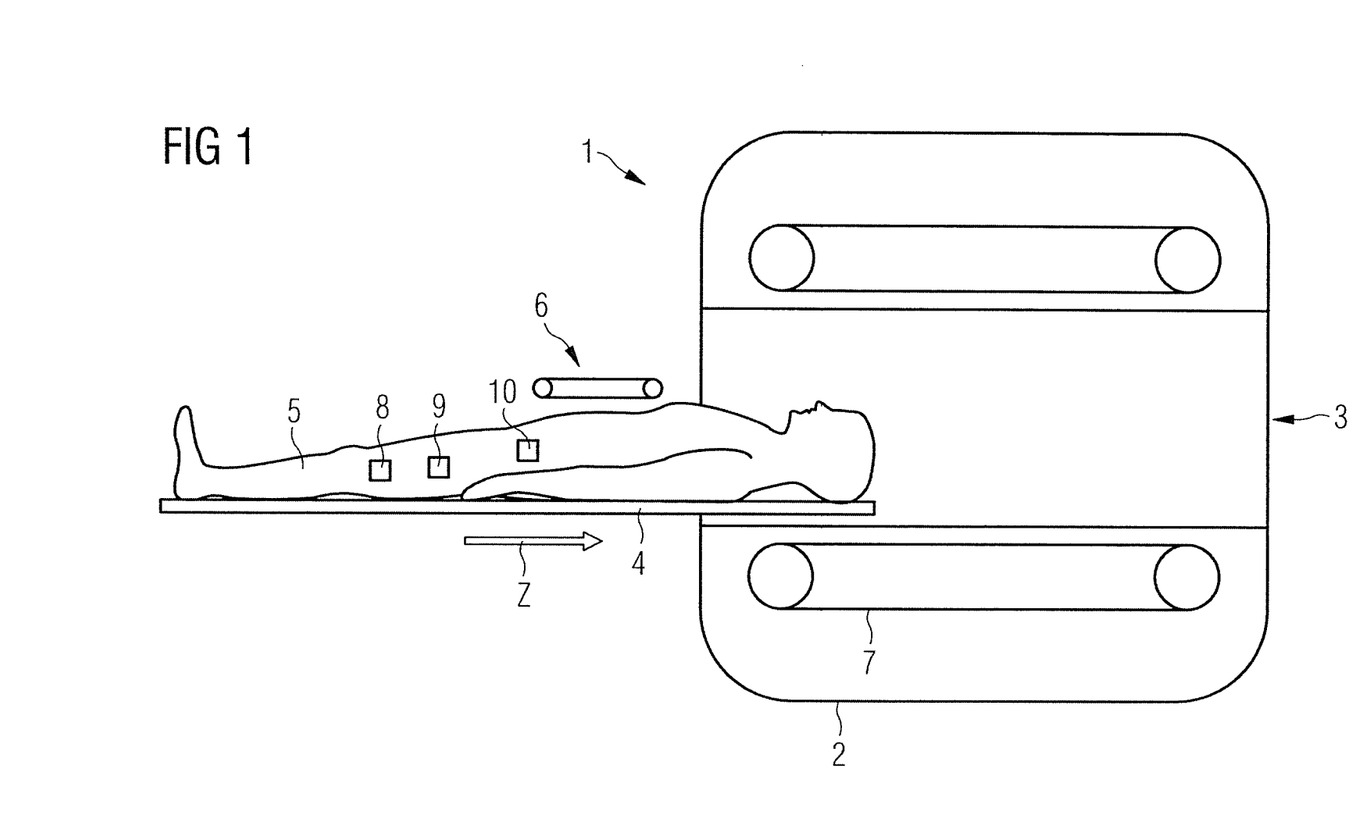
FIG. 1 schematically illustrates a magnetic resonance tomography apparatus.

FIG. 1 shows a magnetic resonance apparatus (MRT) 1 with a whole-body coil 2 and a tube-shaped space 3 into which a patient bed 4 with an examination subject (for example a patient 5) and a local coil arrangement 6 can be driven in order to generate exposures of a subject 5 (for example a patient or a measurement dummy or another subject) that can be additionally processed afterward.

With regard to physical background:

In three-dimensional representation (for the coordinates x, y, z), an electrical field generated by N electrical transmission coils of at least one TX array can be represented as a vector with length 3*N, for example:

$$E=(E1X,E1Y,E1Z,E2X,E2Y,E2Z,\ldots,ENX,ENY,ENZ).$$

A vector U of voltages (also called antenna element values in the following because they respectively cause a field strength caused by an antenna) respectively present at M (=Nchannels, for example eight) transmission coils is, for example, $$U=(U1,\ldots,UM)$$

A complex sensitivity matrix Z here is defined by, for example:

$$E=Z*U(\text{typically a}(3*300)\times 8 \text{ matrix}).$$

A complex sensitivity matrix Z describes which electrical field component is generated at a specific position (for example in a voxel in the shape of one of the hotspot points) in an examination subject/patient when a transmission coil is charged with an RFPA voltage U, and in fact for all examined positions (for example 300 examined hotspot points) and all $N_{channels}$ (for example eight) transmission coils.

The local power loss that is generated by each E-field portion at one of the hotspots can be expressed as:

$$P=\sigma*\overline{Z}*T*Z.$$

T is a sum of the dependencies of the RFPA values for each antenna:

$$Tij=\overline{U}_i*Uj(\text{typically an } N_{channels}\times N_{channels} \text{ symmetrical matrix})$$

wherein σ is a vector that represents the complex permittivity or dielectricity (for 3 axes) for each hotspot. Since a typical model of a living human body does not take into account the directional dependency (thus assumes an anisotropy), the same value is respectively used in a vector a for the axes X, Y, Z for a hotspot point (examination point). Therefore σ is 3*N long and typically has a size of approximately 3×300 elements as a matrix.

Figure 2:
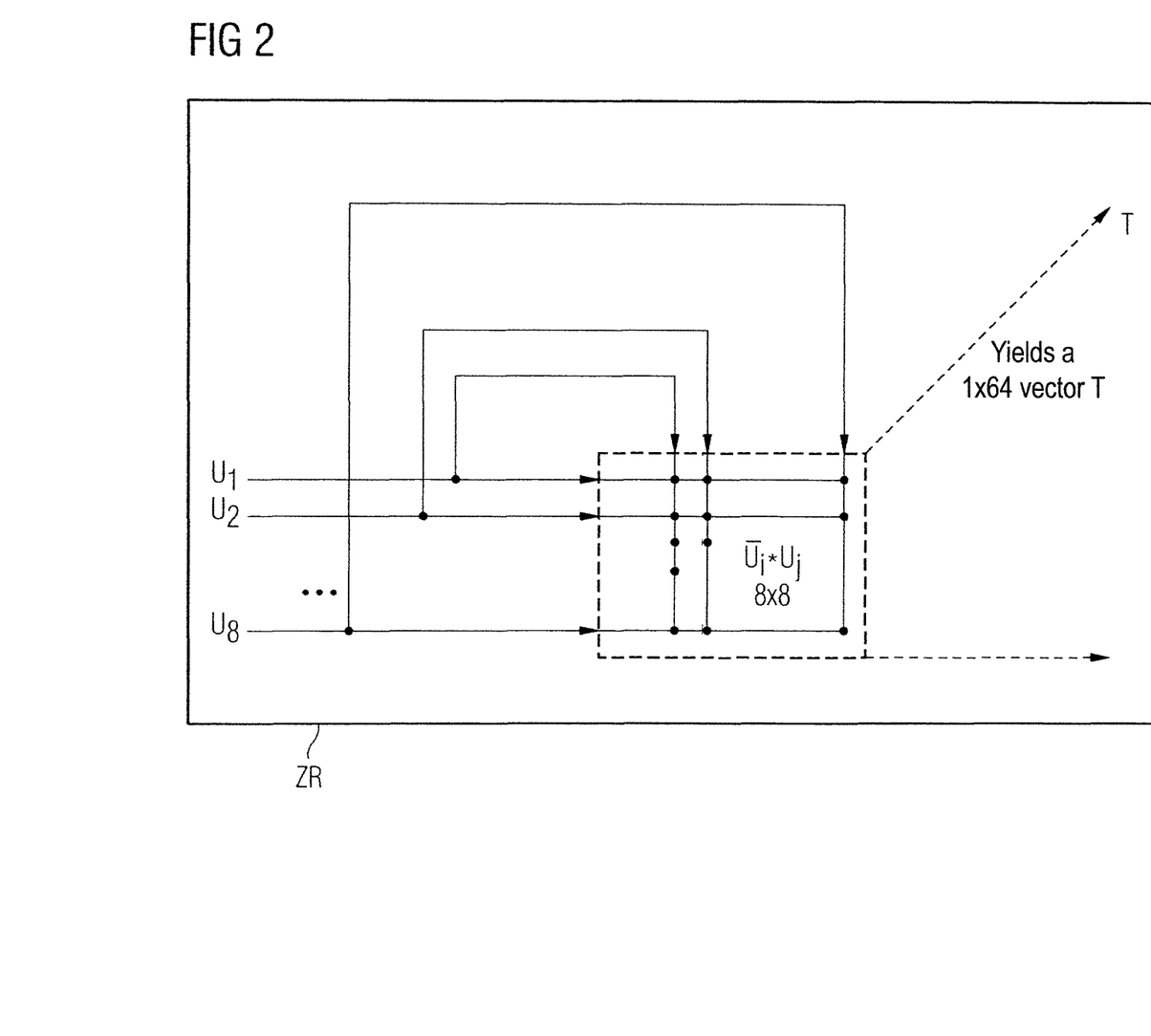
FIG. 2 schematically shows the determination of single-column (1*64) cross-correlation matrices of an antenna element matrix of antenna element values of multiple antenna elements of the magnetic resonance tomography transmission system, in accordance with the invention.

FIG. 2 schematically shows the determination of single-line cross-correlation matrices, which in this case are single-column (1*64) cross-correlation matrices (T; T1, T2, T3, T4) of an antenna element matrix (U=(U1 U2 U3 U4 U5 U6 U7 U8)) of antenna element values (U1, U2, U3, U4, U5, U6, U7, U8) of multiple antenna elements (TxCh 1 through TxCH 8) of the magnetic resonance tomography transmission system (1), for example every 1-50 ms, in particular that can ensue every 10 ms. U1 through U8 are thereby complex TX amplitudes averaged over 10 ms.

The cross-correlation of an antenna element matrix U=(U1 U2 U3 U4 U5 U6 U7 U8) of antenna element values (U1, U2, U3, U4, U5, U6, U7, U8) (thus here its per-element product with its transpose, yields a single-column (1*64) cross-correlation matrix T with 1×64 elements.

The single-column (1*64) cross-correlation matrix T thus appears as in FIG. 9, for example.

The generation of the single-column (1*64) cross-correlation matrix T for a point in time can ensue very quickly with processors provided for this, for example.

Figure 3:
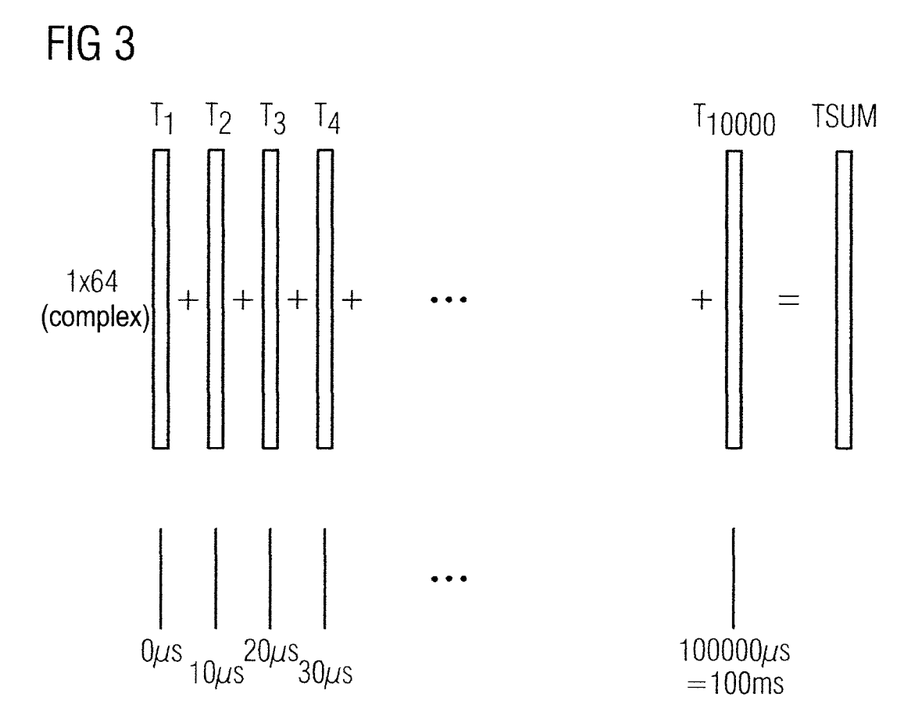
FIG. 3 shows the summation of single-column (1*64) cross-correlation matrices over a time period of 100 ms, for example, in accordance with the invention.

FIG. 3 shows the summation of single-column (1*64) cross-correlation matrices T1, T2, T3, T4 respectively determined for multiple points in time (for example here ten thousand points in time after 0 ms, 10 ms, 20 ms and 40 ms etc. up to 10,000 ms) over a time period of, for example, 100 ms for the sum cross-correlation matrix $T_{SUM}$.

Figure 4:
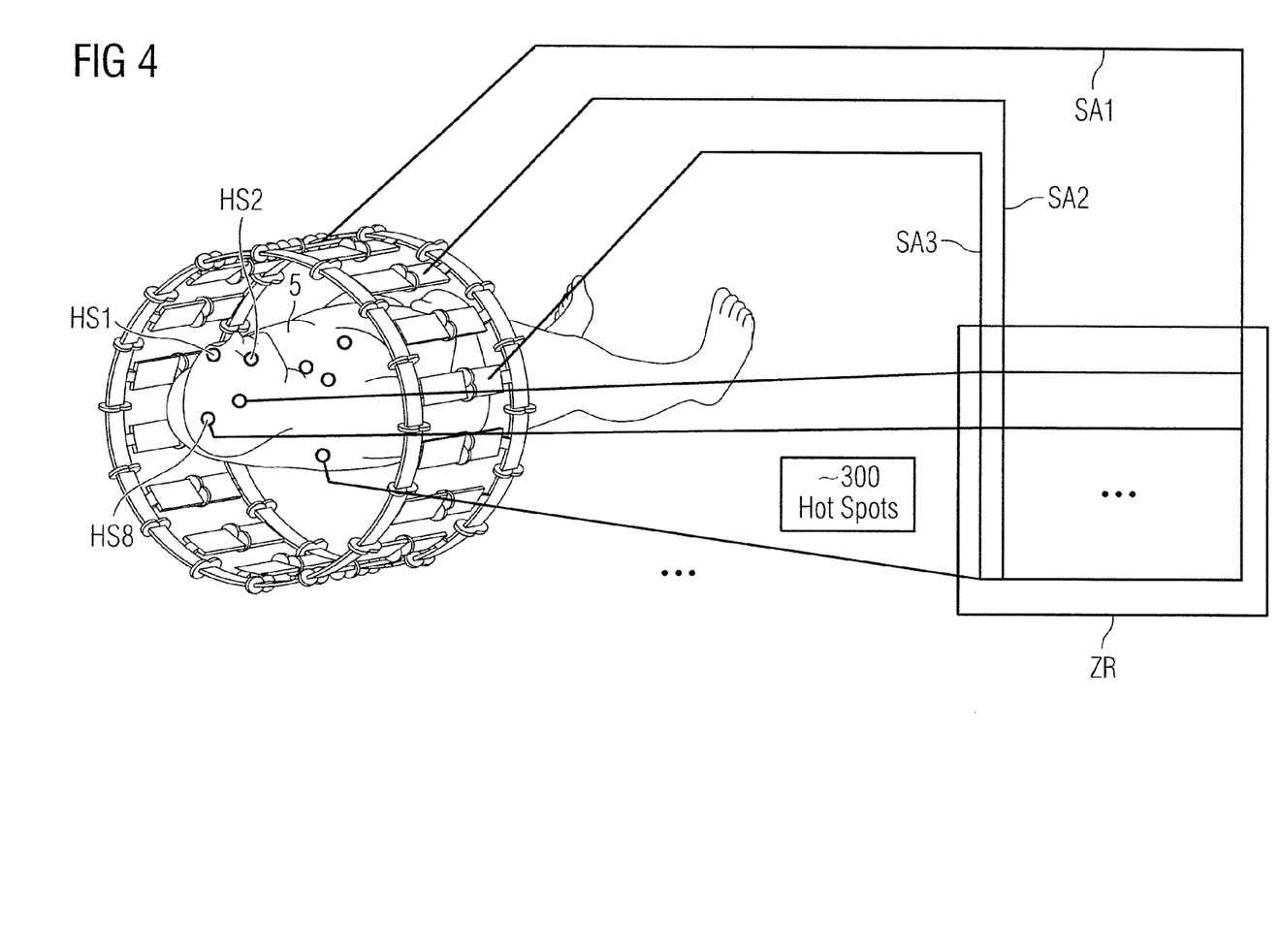
FIG. 4 is an illustration of the meaning of a possible stored hotspot sensitivity matrix that is to be used, in accordance with the invention.

FIG. 4 illustratively shows how a hotspot sensitivity matrix ($Z*\overline{Z}$) can be formed via cross-correlation of a hotspot sensitivity matrix Z with the aid of its transpose $\overline{Z}$. The hotspot sensitivity matrix Z and/or its transpose $\overline{Z}$ and/or the hotspot sensitivity matrix ($Z*\overline{Z}$) can, for example, also be calculated in advance for specific cases (such as the examination subject with specific weight, size, shape, organ position etc., for instance) and be stored, wherein it is then also simply loaded for calculation (of SAR).

The hotspot sensitivity matrix Z contains the sensitivity for many hotspot points (points to be monitored in the examination subject or patient 4) such as the hotspot points HS1 through HS8 shown here as an example. The sensitivity zz can be the quotient of the field strength E (that results from a voltage U at a hotspot point) and the voltage U; a sensitivity zz can also exist for each of three axes x, y, z; in this case the SAR values are determined and added for every axis x, y, z, or alternatively the SAR values can be set identically for each axis x, y, z.

The lines shown in FIG. 4 from hotspots to the computer ZRT here are not conductors; rather, here they symbolize that a sensitivity value for these hotspots is present in a hotspot sensitivity matrix in the computer. (A sensitivity matrix could, for example, be obtained from body models for patients with specific weight or size or fat ratio etc.)

For example, approximately 100 to a thousand (for example 300) hotspots in an examination subject can be examined.

With the control lines SA1, SA2, SA3 (shown by way of example), the voltages at or the current in the antenna elements TxCh 1, TxCh 2, TxCH 3 can be reduced or deactivated by a computer ZR upon exceeding a SAR value.

Figure 5:
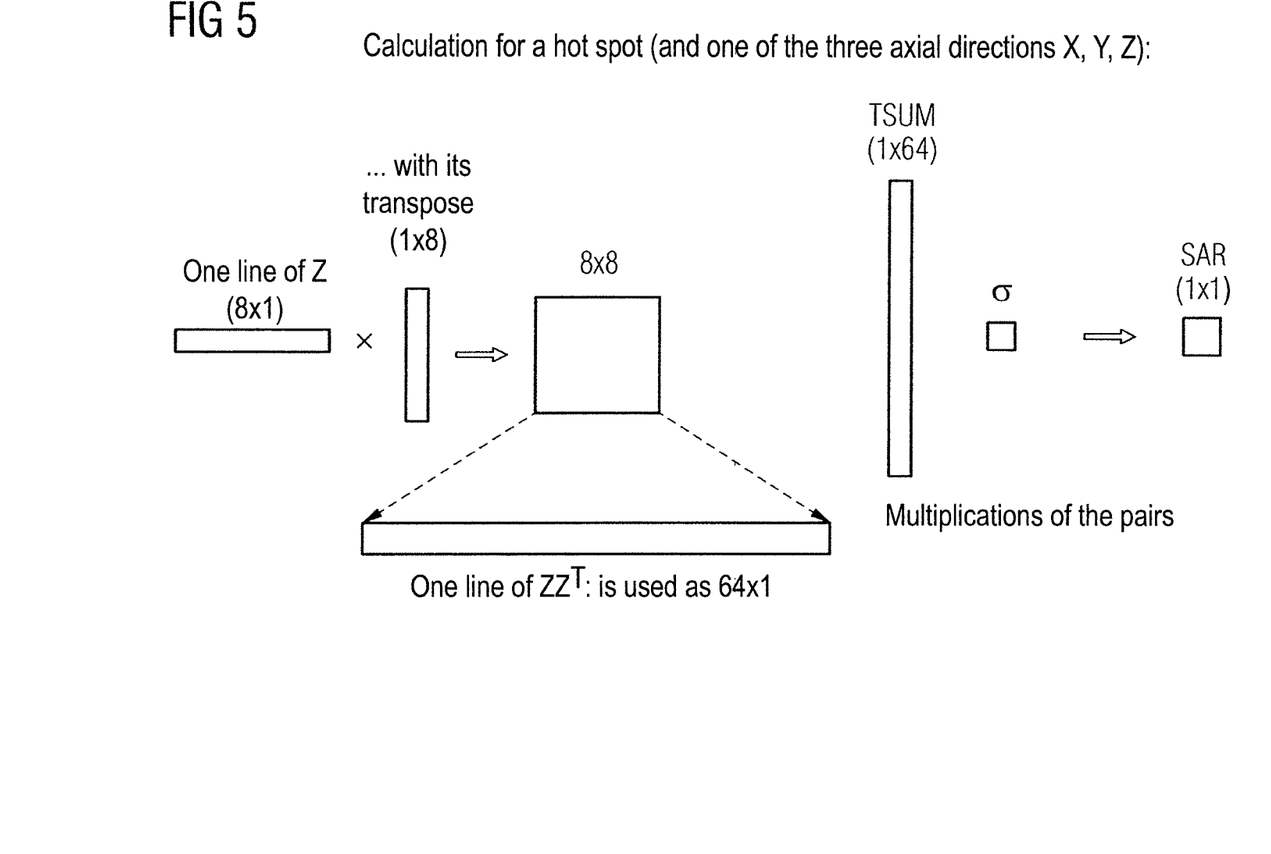
FIG. 5 is an illustration of a hotspot point and the calculation of a SAR value at this hotspot point for one of the three axes x, y, z, in accordance with the invention.

For a hotspot point (and for one of the three axes x, y, z), FIG. 5 illustratively shows the calculation (ensuing approximately every 100 ms, for example) of a SAR value at this hotspot point.

One line of Z is multiplied with the transpose of the line in order to obtain the hotspot sensitivity matrix Z*Z with 64*1 lines.

The hotspot sensitivity matrix Z*Z with 64*1 lines is multiplied with the sum cross-correlation matrix $T_{sum}$ (with 1*64 lines) and then multiplied with a value s representing the dielectricity at the hotspot point ("Hotspot HS1"), which yields a SAR value (for example a 1*1 matrix, thus a number) for this hotspot and this axial direction (x, y or z). This SAR value can be determined for each of the axial directions x, y, z, and the SAR values can be added into a total SAR value of this hotspot. If a SAR value at this hotspot exceeds a predetermined upper limit, the voltage applied to the antenna elements TxCh 1 through TxCH 8 can respectively be reduced or cut off completely.

Figure 6:
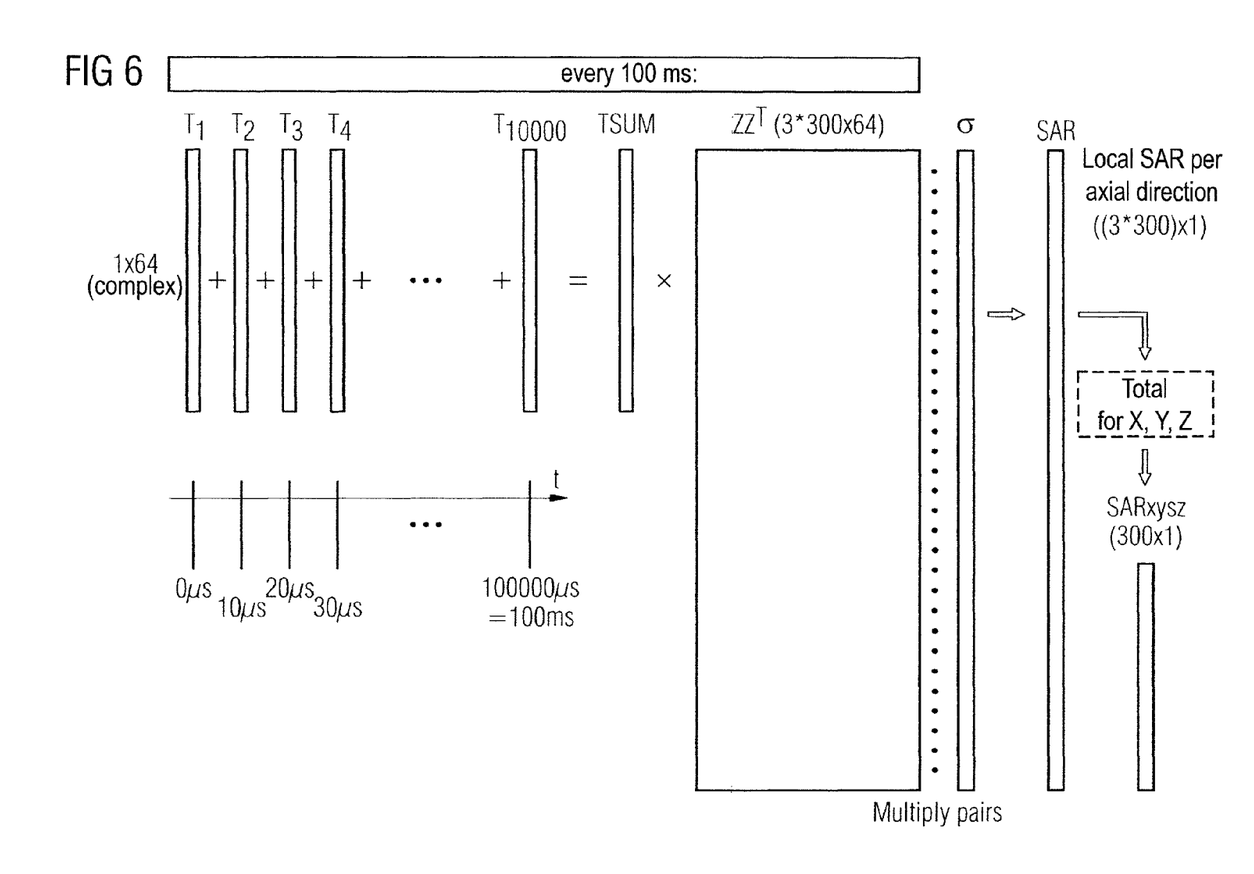
FIG. 6 shows respective steps that occur at respective 100 ms intervals, in accordance with the invention.

FIG. 6 explains what is done at 100 ms, for example. The single-column cross-correlation matrices T1, T2, T3, T4 ... T1000 that are respectively determined for points in time after 0 ms, 10 ms, 20 ms, 30 ms and 40 ms etc. up to 100000 ms are added over a time period of, for example, 100 ms into a sum cross-correlation matrix $T_{SUM}$. The sum cross-correlation matrix $T_{SUM}$ is multiplied with a hotspot sensitivity matrix Z*Z (for 3 axial directions and 300 hotspots and 64 lines of Z*Z per), the product is multiplied with a value representing the dielectricity (s) at the hotspot point (for example hotspot HS1) in order to determine a SAR value "SAR" for this hotspot and this axial direction x or y or z; this respectively ensues for the three axial directions x, y, z. The SAR values (SAR) for the three axial directions x, y, z are added in particular into SARxyz for this hotspot point (and overall 300 hotspot points, thus SAR has the format of 300*1 individual values) in the examination subject.

The SAR value (that is the sum of three SAR values of the three axes x, y, z, each at a respective hotspot) for each of the (here 300) monitored hotspot points is compared with an upper limit (predetermined from safety reasons, for example), and if a SAR value exceeds the upper limit (at at least one hotspot point) the voltage (for example) applied to antenna elements (TxCH 1 through TxCH 8) or the current flowing in said antenna elements is reduced or cut off.

Figure 7:
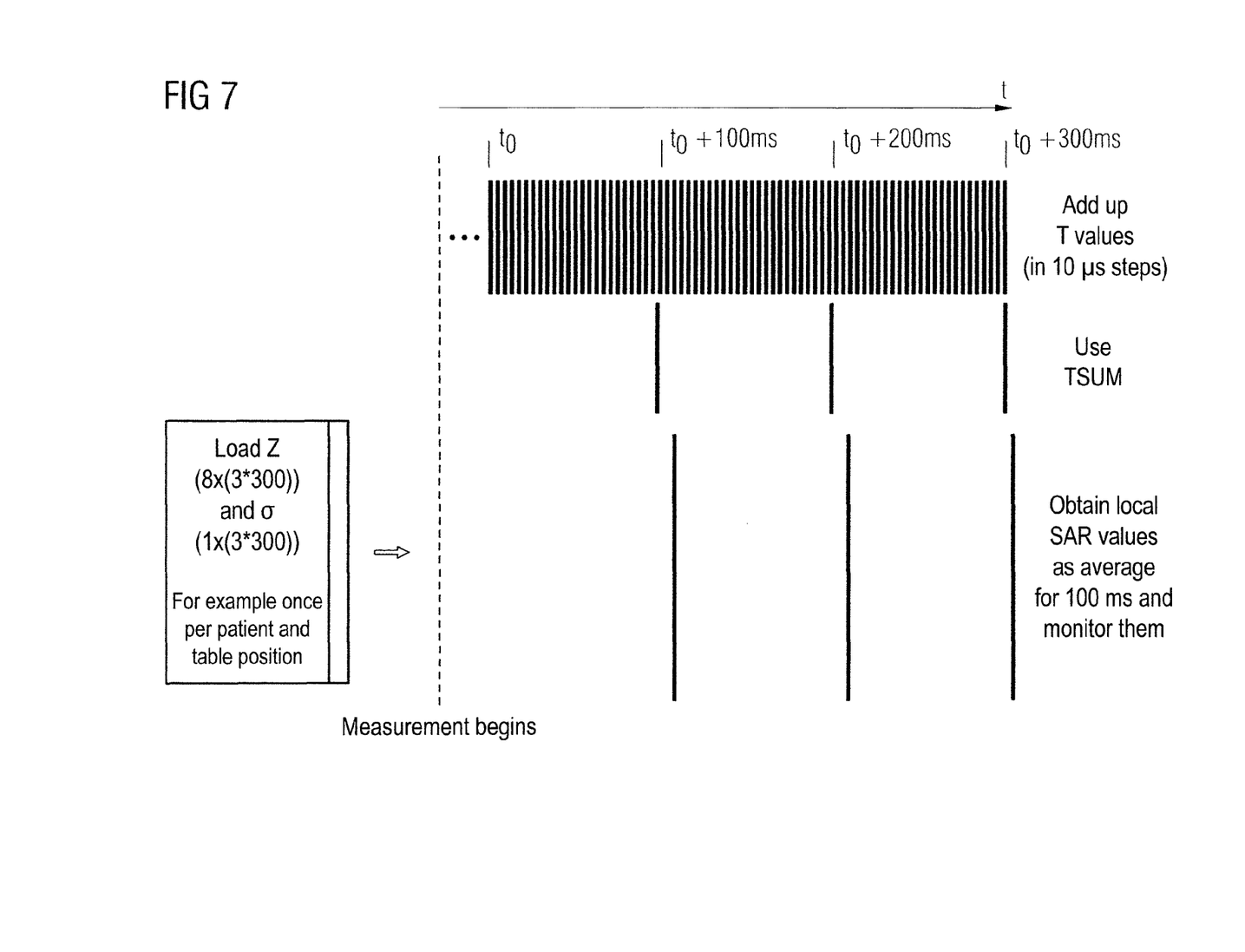
FIG. 7 is a summary of steps occurring over a larger time period, in accordance with the invention.
Figure 8:
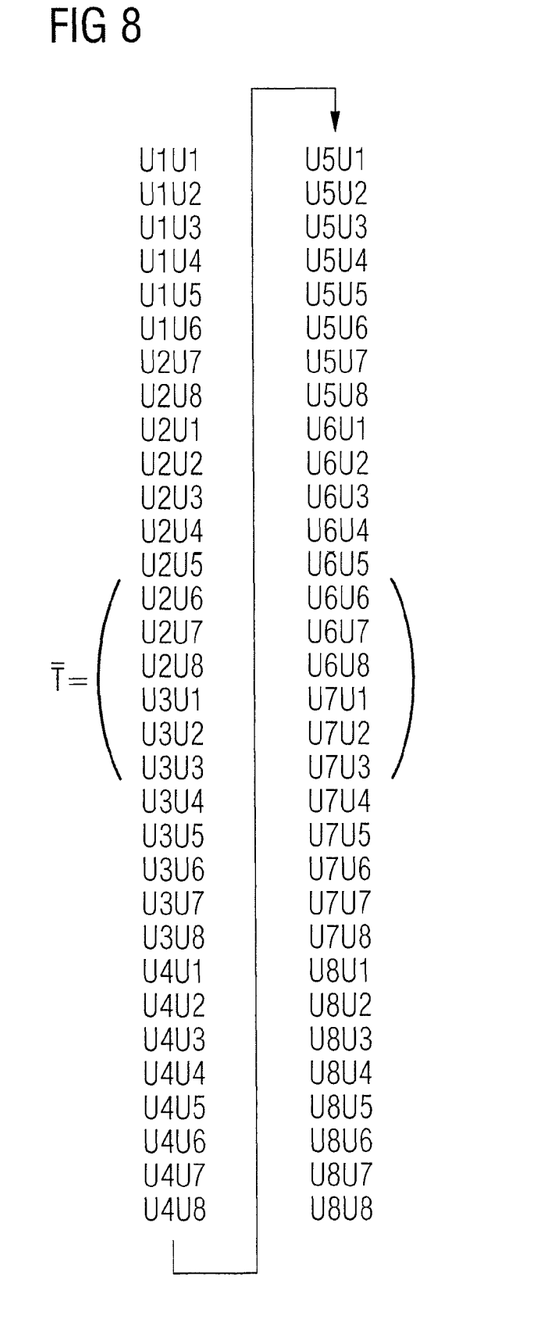
FIG. 8 shows a T-matrix, in accordance with the invention.

FIG. 7 shows a summation over a longer period of time.

For example, the matrix Z (8×(3*300)) and the matrix σ (1×(3*300) are loaded from a memory once per patient/examination subject to be examined and per table position that is assumes on an examination table in the magnetic resonance tomography system, and a measurement is begun at a measurement start $t_0$, wherein respective T-matrices $T_1, T_2, T_3, T_4$ etc. are formed via summation at 10 ms time intervals, whereupon a sum cross-correlation matrix $T_{SUM}$ is determined from T-matrices $T_1, T_2, T_3, T_4$ etc., wherein a set of SAR values (over a 100 ms average, for example) is determined and is monitored in a SAR monitoring device for compliance with an upper limit for all hotspot points.

For the antenna element values (antenna currents or voltages at the antenna elements) of the individual array elements, the (complex) cross-correlation values can be calculated and chronologically totaled in a very quick succession. The sensitivity matrices dependent on the patient are not yet required for this; the calculation can thus also ensue in advance for stored standard pulses.

The energy applied in a given longer time interval can then be obtained by multiplying sensitivity matrices (for example from left and right) with the chronologically totaled cross-correlation matrix. Given the use if numerous model points (that are observed in the subject or patient, here also called hotspots), this portion of the calculation (also called "evaluation" in the following) is normally significantly more comprehensive than the calculation of a time step for the signal cross-correlation. However, it can be implemented significantly less often than the time steps of the cross-correlation.

The cross-correlation matrices for the pulses can be determined in an analogous manner for the calculation of the global power loss, and these cross-correlation matrices are multiplied with the conductance matrix of both sides.

Only those calculations that should actually be implemented quickly due to the variance of the phase ratios can thus also be implemented for every time step, but the significantly more complicated evaluation of the electrical power is implemented only as often as is reasonable due to the thermal relaxation time. This is normally multiple orders of magnitude slower than the change of the phase ratios of the voltages at antenna elements.

Furthermore, no knowledge of a sensitivity matrix is required for fast calculation, rather only the knowledge of the antenna element values. This also enables implementations in which the cross-correlation determination ensues very close to hardware (for example with a separate process in an activation module (for example T) of the transmission elements), but the less frequent evaluation step with a multiplication with sensitivity matrices is then implemented at another point (for example ZR) of the system.

It is noted that the available conductivity models of human bodies (for example "HUGO") currently contain only scalar conductivities. However, if entire groups of voxels are assembled for the SAR calculation it can be reasonable to represent their generally effective occurring anisotropy of the conductivity with tensors that then embody the matrix elements of the sensitivity matrix.

For practical application, in principle the following two possibilities arise in particular:

1) "Look-ahead" calculation for complete pulses: the cross-correlation matrix is totaled for a complete transmission pulse and is subsequently evaluated by multiplication with the sensitivity matrices. This enables an efficient, accelerated calculation.

2) Running calculation ("online monitoring"): as described, an online monitoring of the local SAR is necessary given TX arrays and is presently mandatory. In operation of the TX array system, for example, a single-column (1*64) cross-correlation matrix can be continuously calculated for time intervals in close succession (on an order of one second), is evaluated at the end of the interval with the aid of the sensitivity matrix, and the results for the locally released heat quantities (in, for example, hotspot points chosen with random distribution) are supplied to a continuous, concurrently running monitoring. This would deactivate the transmission elements (also called antenna elements here) upon exceeding SAR limit values set for different time intervals. Such a monitoring could function without prior knowledge of the precalculated pulses, solely using the controller of the transmitter.

Upper limits for SAR values in MRTs can be predetermined; for example, they can be 0.6 W/kg or a completely different value.

Although modifications and changes may be suggested by those skilled in the art, it is the intention of the inventor to embody within the patent warranted hereon all changes and modifications as reasonably and properly come within the scope of his contribution to the art.

We claim:

1. A method to determine SAR in a magnetic resonance tomography system with multiple, individually-controlled antenna transmission elements, and control electronics configured to control each antenna element to radiate an RF pulse into an examination subject in the tomography system that releases energy into the subject, said method comprising the steps of:
in a first part of a computerized processor, said first part being in said control electronics, calculating a single-line cross-correlation matrix for each of multiple points in time or time periods that contains, as elements, respective products of a respective antenna element value of said multiple antenna elements with that or another respective antenna element value;
in said first part of said processor, adding the single-line cross-correlation matrices into a sum cross-correlation matrix over a summation time period;
in loading a hotspot sensitivity matrix into a second part of said processor at a different location in said tomography system from said control electronics, said hotspot sensitivity matrix comprising matrix elements respectively representing sensitivities in at least one respective direction at a plurality of hotspot points in the subject and, in said second part of said processor, multiplying said sum cross-correlation matrix with said hotspot sensitivity matrix;
in said second part of said processor, multiplying the product of the sum cross-correlation matrix and the hotspot sensitivity matrix with a value representing the dielectricity at at least one hotspot point in order to determine a respective SAR value for each hotspot point; and
when at least one SAR value exceeds a predetermined upper limit, reducing or deactivating in said first part of said processor a voltage applied to at least one of said antenna elements or a current flowing in at least one antenna of said elements by said control electronics.

2. A method according to claim 1, comprising:
during the irradiation of the subject repeatedly determining the SAR values at the hotspots for successive time periods; and
reducing or deactivating the voltage present at antenna elements or the current flowing in antenna elements the SAR value at at least one hotspot exceeds a predetermined limit in a time period.

3. A method according to claim 1, comprising:
determining each hotspot SAR value for each of the plurality of hotspots, and electronically storing the determined hotspot SAR values.

4. A method according to claim 1, comprising:
generating the hotspot sensitivity matrix as the product of a matrix representing the sensitivity in at least one direction at a plurality of hotspot points in the body of the subject and its transpose.

5. A method according to claim 1, comprising:
determining the element values of respective antenna elements with a respective local coil via measurement of the field caused by the respective antenna element and representing respective specific field strengths.

6. A method according to claim 1, comprising:
determining the antenna element values of respective antenna elements with a directional coupler in a voltage feed line to the antenna element.

7. A method according to claim 1, comprising:
determining the antenna element values as a voltage present at each antenna element.

8. A method according to claim 1, comprising:
determining the antenna element values as a current flowing in each antenna element.

9. A method according to claim 1, comprising:
determining the antenna element values as a field strength measured at or in proximity to each antenna element.

10. A method according to claim 1, comprising:
employing, as the points in time for which antenna element values of the antenna elements are determined, with a time interval of 5 to 15 microseconds.

11. A method according to claim 1, comprising:
employing a sensitivity that is a quotient of the field strength and the voltage at a hotspot point.

12. A method according to claim 1, comprising:
employing, as the hotspot points, respective point or voxel in the examination subject.

13. A method according to claim 1 wherein either the single-line cross-correlation matrix is single-column matrix and the hotspot sensitivity matrix is single-row matrix, or vice versa.

14. A method to determine SAR in a magnetic resonance tomography system with multiple, individually-controlled antenna transmission elements that each radiate an RF pulse into an examination subject in the tomography system that releases energy into the subject, comprising:
in a computerized processor, calculating a single-line cross-correlation matrix for multiple points in time or time periods that contains, as elements, respective products of a respective antenna element value of said multiple antenna elements with that or another respective antenna element value;
in said processor, adding the single-line cross-correlation matrices into a sum cross-correlation matrix over a summation time period by, during an examination, totaling cross-correlation matrices over the duration of the RF pulse into the sum cross-correlation matrix for points in time or time periods of a complete RF pulse;
in said processor, multiplying the sum cross-correlation matrix with a hotspot sensitivity matrix with elements of the hotspot sensitivity matrix respectively representing sensitivities in at least one respective direction at a plurality of hotspot points in the subject;
in said processor, multiplying the product of the sum cross-correlation matrix and the hotspot sensitivity matrix with a value representing the dielectricity at at least one hotspot point in order to determine a respective SAR value for each hotspot point; and
when at least one SAR value exceeds a predetermined upper limit, reducing or deactivating a voltage applied to at least one of said antenna elements or a current flowing in at least one antenna of said elements by not transmitting the transmission pulse if at least one SAR value exceeds the predetermined limit.

15. A method to determine SAR in a magnetic resonance tomography system with multiple, individually-controlled antenna transmission elements that each radiate an RF pulse into an examination subject in the tomography system that releases energy into the subject, comprising:
in a computerized processor, calculating a single-line cross-correlation matrix for multiple points in time or time periods that contains, as elements, respective products of a respective antenna element value of said multiple antenna elements with that or another respective antenna element value;

in said processor, adding the single-line cross-correlation matrices into a sum cross-correlation matrix over a summation time period;

in said processor, multiplying the sum cross-correlation matrix with a hotspot sensitivity matrix with elements of the hotspot sensitivity matrix respectively representing sensitivities in at least one respective direction at a plurality of hotspot points in the subject;

in said processor, multiplying the product of the sum cross-correlation matrix and the hotspot sensitivity matrix with a value representing the dielectricity at at least one hotspot point in order to determine a respective SAR value for each hotspot point by addition of three SAR values respectively calculated for one of three directions orthogonal to one another; and when at least one SAR value exceeds a predetermined upper limit, reducing or deactivating a voltage applied to at least one of said antenna elements or a current flowing in at least one antenna of said elements.

16. A method to determine SAR in a magnetic resonance tomography system with multiple, individually-controlled antenna transmission elements that each radiate an RF pulse into a current examination subject in the tomography system that releases energy into the current subject, comprising:

in a computerized processor, calculating a single-line cross-correlation matrix for multiple points in time or time periods that contains, as elements, respective products of a respective antenna element value of said multiple antenna elements with that or another respective antenna element value;

in said processor, adding the single-line cross-correlation matrices into a sum cross-correlation matrix over a summation time period;

pre-determining and storing a plurality of hotspot sensitivity matrices, before irradiating the current subject with the transmission array, respectively for multiple models of different examination subjects each hotspot sensitivity matrix comprising elements respectively representing sensitivities in at least one respective direction at a plurality of hotspot points in the current subject;

selecting one of said multiple stored models, as a selected model, based on examination subject parameters of the current subject, selected from the group consisting of weight, size and shape and selecting the respective hotspot matrix, as a selected hotspot matrix, from among said plurality of hotspot matrices, determined for the selected model;

in said processor, multiplying the sum cross-correlation matrix with the selected hotspot sensitivity matrix;

in said processor, multiplying the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, reducing or deactivating a voltage applied to at least one of said antenna elements or a current flowing in at least one antenna of said elements.

17. A method to determine SAR in a magnetic resonance tomography system with multiple, individually-controlled antenna transmission elements that each radiate an RF pulse into an examination subject in the tomography system that releases energy into the subject, comprising:

determining, for each of said antenna elements, an antenna element value as an average value selected from the group consisting of an average voltage and an average field strength, and an average current, within a time period at each antenna element;

in a computerized processor, calculating a single-line cross-correlation matrix for multiple points in time or time periods that contains, as elements, respective products of the respective antenna element value of said multiple antenna elements with that or another respective antenna element value;

in said processor, adding the single-line cross-correlation matrices into a sum cross-correlation matrix over a summation time period;

in said processor, multiplying the sum cross-correlation matrix with a hotspot sensitivity matrix with elements of the hotspot sensitivity matrix respectively representing sensitivities in at least one respective direction at a plurality of hotspot points in the subject;

in said processor, multiplying the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, reducing or deactivating a voltage applied to at least one of said antenna elements or a current flowing in at least one antenna of said elements.

18. A method to determine SAR in a magnetic resonance tomography system with multiple, individually-controlled antenna transmission elements that each radiate an RF pulse into an examination subject in the tomography system that releases energy into the subject, comprising:

in a computerized processor, calculating a single-line cross-correlation matrix for multiple points in time or time periods that contains, as elements, respective products of a respective antenna element value of said multiple antenna elements with that or another respective antenna element value;

in said processor, adding the single-line cross-correlation matrices into a sum cross-correlation matrix over a summation time period of 50 to 500 milliseconds, at multiple points in time;

in said processor, multiplying the sum cross-correlation matrix with a hotspot sensitivity matrix with elements of the hotspot sensitivity matrix respectively representing sensitivities in at least one respective direction at a plurality of hotspot points in the subject;

in said processor, multiplying the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, reducing or deactivating a voltage applied to at least one of said antenna elements or a current flowing in at least one antenna of said elements.

19. A method to determine SAR in a magnetic resonance tomography system with multiple, individually-controlled antenna transmission elements that each radiate an RF pulse into an examination subject in the tomography system that releases energy into the subject, comprising:

in a computerized processor, calculating a single-line cross-correlation matrix for multiple points in time or time periods that contains, as elements, respective products of a respective antenna element value of said multiple antenna elements with that or another respective antenna element value;

before irradiating the subject with said transmission array, pre-calculating and storing the single-line cross-correlation matrix of an antenna element matrix of antenna element values of the multiple antenna elements at multiple points in time or time periods and for one or more RF pulses at the antenna elements;

in said processor, adding the single-line cross-correlation matrices into a sum cross-correlation matrix over a summation time period;

in said processor, multiplying the sum cross-correlation matrix with a hotspot sensitivity matrix with elements of the hotspot sensitivity matrix respectively representing sensitivities in at least one respective direction at a plurality of hotspot points in the subject;

in said processor, multiplying the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, reducing or deactivating a voltage applied to at least one of said antenna elements or a current flowing in at least one antenna of said elements.

20. A device to determine SAR in a magnetic resonance tomography system with multiple, individually-controlled, antenna transmission elements, and control electronics configured to control each antenna element to radiate an RF pulse into an examination subject in the tomography system that releases energy into the subject, comprising:

a computerized processor comprising a first processor part configured to calculate a single-line cross-correlation matrix for multiple points in time or time periods that contains, as elements, respective products of a respective antenna element value of said multiple antenna elements with that or another respective antenna element value said first processor part being in said control electronics;

said first processor part being configured to add the single-line cross-correlation matrices into a sum cross-correlation matrix over a summation time period;

said processor comprising a second processor part at a different location in said tomography system other than said control electronics, configured to have a hotspot sensitivity matrix loaded therein, with elements of the hotspot sensitivity matrix respectively representing sensitivities in at least one respective direction at a plurality of hotspot points in the subject, and to multiply the sum cross-correlation matrix with the hotspot sensitivity matrix;

said second processor part being configured to multiply the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, said first processor part being configured to reduce or deactivate a voltage applied to at least one of said antenna elements or a current flowing in at least one antenna of said antenna elements by said control electronics.

21. A device according to claim 20 wherein said processor is configured to:

during the irradiation of the subject repeatedly determine the SAR values at the hotspots for successive time periods; and reduce or deactivate the voltage present at antenna elements or the current flowing in antenna elements the SAR value at at least one hotspot exceeds a predetermined limit in a time period.

22. A device according to claim 20 wherein said processor is configured to:

determine each hotspot SAR value for each of the plurality of hotspots, and electronically store the determined hotspot SAR values.

23. A device according to claim 20 wherein said processor is configured to:

generate the hotspot sensitivity matrix as the product of a matrix representing the sensitivity in at least one direction at a plurality of hotspot points in the body of the subject and its transpose.

24. A device according to claim 20 wherein said processor is configured to:

determine the element values of respective antenna elements with a respective local coil via measurement of the field caused by the respective antenna element and representing respective specific field strengths.

25. A device according to claim 20 wherein said processor is configured to:

determine the antenna element values of respective antenna elements with a directional coupler in a voltage feed line to the antenna element.

26. A device according to claim 20 wherein said processor is configured to:

determine the antenna element values as a voltage present at each antenna element.

27. A device according to claim 20 wherein said processor is configured to:

determine the antenna element values as a current flowing in each antenna element.

28. A device according to claim 20 wherein said processor is configured to:

determine the antenna element values as a field strength measured at or in proximity to each antenna element.

29. A device according to claim 20 wherein said processor is configured to:

employ, as the points in time for which antenna element values of the antenna elements are determined, with a time interval of 5 to 15 microseconds.

30. A device according to claim 20 wherein said processor is configured to:

employ a sensitivity that is a quotient of the field strength and the voltage at a hotspot point.

31. A device according to claim 20 wherein said processor is configured to:

employ, as the hotspot points, respective point or voxel in the examination subject.

32. A device according to claim 20 wherein either the single-line cross-correlation matrix is single-column matrix and the hotspot sensitivity matrix is single-row matrix or vice versa.

33. A device to determine SAR in a magnetic resonance tomography system with multiple, individually-controlled antenna transmission elements that each radiate an RF pulse into an examination subject in the tomography system that releases energy into the subject, comprising:

a computerized processor configured to calculate a single-line cross-correlation matrix for multiple points in time or time periods that contains, as elements, respective products of a respective antenna element value of said multiple antenna elements with that or another respective antenna element value by, during an examination, totaling cross-correlation matrices over the duration of the transmission pulse into the sum cross-correlation matrix for points in time or time periods of a complete transmission pulse;

said processor being configured to add the single-line cross-correlation matrices into a sum cross-correlation matrix over a summation time period;

said processor being configured to multiply the sum cross-correlation matrix with a hotspot sensitivity matrix with elements of the hotspot sensitivity matrix respectively representing sensitivities in at least one respective direction at a plurality of hotspot points in the subject;

said processor being configured to multiply the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, said processor being configured to reduce or deactivate a voltage applied to at least one of said antenna elements or a current flowing in at least one of said antenna elements by not transmitting the transmission pulse if at least one SAR value exceeds the predetermined limit.

34. A device to determine SAR in a magnetic resonance tomography system with multiple, individually-controlled antenna transmission elements that each radiate an RF pulse into an examination subject in the tomography system that releases energy into the subject, comprising:

a computerized processor configured to calculate a single-line cross-correlation matrix for multiple points in time or time periods that contains, as elements, respective products of a respective antenna element value of said multiple antenna elements with that or another respective antenna element value;

said processor being configured to add the single-line cross-correlation matrices into a sum cross-correlation matrix over a summation time period;

said processor being configured to multiply the sum cross-correlation matrix with a hotspot sensitivity matrix with elements of the hotspot sensitivity matrix respectively representing sensitivities in at least one respective direction at a plurality of hotspot points in the subject;

said processor being configured to multiply the product of the sum cross-correlation matrix and the hotspot sensitivity matrix with a value representing the dielectricity at at least one hotspot point in order to determine a respective SAR value for each hotspot point by addition of three SAR values respectively calculated for one of three directions orthogonal to one another; and when at least one SAR value exceeds a predetermined upper limit, said processor being configured to reduce or deactivate a voltage applied to at least one of said antenna elements or a current flowing in at least one of said antenna elements.

35. A device to determine SAR in a magnetic resonance tomography system with multiple, individually-controlled antenna transmission elements that each radiate an RF pulse into a current examination subject in the tomography system that releases energy into the current subject, comprising:

a computerized processor configured to calculate a single-line cross-correlation matrix for multiple points in time or time periods that contains, as elements, respective products of a respective antenna element value of said multiple antenna elements with that or another respective antenna element value;

said processor being configured to add the single-line cross-correlation matrices into a sum cross-correlation matrix over a summation time period;

said processor being configured to pre-determine and store a hotspot sensitivity matrix, before irradiating the subject with the transmission array, for each of multiple models of different examination subjects each hotspot sensitivity matrix comprising elements respectively representing sensitivities in at least one respective direction at a plurality of hotspot points in the current subject;

said processor being configured to select one of said multiple stored models, as a selected model, based on examination subject parameters of the subject, selected from the group consisting of weight, size and shape and to select the respective hotspot matrix, as a selected hotspot matrix, from among said plurality of hotspot matrices, determined for the selected model;

said processor being configured to multiply the sum cross-correlation matrix with the selected hotspot sensitivity matrix;

said processor being configured to multiply the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, said processor being configured to reduce or deactivate a voltage applied to at least one of said antenna elements or a current flowing in at least one of said antenna elements.

36. A device to determine SAR in a magnetic resonance tomography system with multiple, individually-controlled antenna transmission elements that each radiate an RF pulse into an examination subject in the tomography system that releases energy into the subject, comprising:

said processor being configured to determine, for each antenna element, an antenna element value as an average value selected from the group consisting of an average voltage and an average field strength, and an average current, within a time period at the respective antenna element;

a computerized processor configured to calculate a single-line cross-correlation matrix for multiple points in time or time periods that contains, as elements, respective products of the respective antenna element value of said multiple antenna elements with that or another respective antenna element value;

said processor being configured to add the single-line cross-correlation matrices into a sum cross-correlation matrix over a summation time period;

said processor being configured to multiply the sum cross-correlation matrix with a hotspot sensitivity matrix with elements of the hotspot sensitivity matrix respectively representing sensitivities in at least one respective direction at a plurality of hotspot points in the subject;

said processor being configured to multiply the product of the sum cross-correlation matrix and the hotspot sensitivity matrix with a value representing the dielectricity at at least one hotspot point in order to determine a respective SAR value for each hotspot point; and when at least one SAR value exceeds a predetermined upper limit, said processor being configured to reduce or deactivate a voltage applied to at least one of said antenna elements or a current flowing in at least one of said antenna elements.

37. A device to determine SAR in a magnetic resonance tomography system with multiple, individually-controlled antenna transmission elements that each radiate an RF pulse into an examination subject in the tomography system that releases energy into the subject, comprising:
 a computerized processor configured to calculate a single-line cross-correlation matrix for multiple points in time or time periods that contains, as elements, respective products of a respective antenna element value of said multiple antenna elements with that or another respective antenna element value;
 said processor being configured to add the single-line cross-correlation matrices into a sum cross-correlation matrix over a summation time period of 50 to 500 milliseconds, at multiple points in time;
 said processor being configured to multiply the sum cross-correlation matrix with a hotspot sensitivity matrix with elements of the hotspot sensitivity matrix respectively representing sensitivities in at least one respective direction at a plurality of hotspot points in the subject;
 said processor being configured to multiply the product of the sum cross-correlation matrix and the hotspot sensitivity matrix with a value representing the dielectricity at at least one hotspot point in order to determine a respective SAR value for each hotspot point; and
 when at least one SAR value exceeds a predetermined upper limit, said processor being configured to reduce or deactivate a voltage applied to at least one of said antenna elements or a current flowing in at least one of said antenna elements.

38. A device to determine SAR in a magnetic resonance tomography system with multiple, individually-controlled antenna transmission elements that each radiate an RF pulse into an examination subject in the tomography system that releases energy into the subject, comprising:
 a computerized processor configured to calculate a single-line cross-correlation matrix for multiple points in time or time periods that contains, as elements, respective products of a respective antenna element value of said multiple antenna elements with that or another respective antenna element value;
 before irradiating the subject with said transmission array, pre-calculate and store the single-line cross-correlation matrix of an antenna element matrix of antenna element values of the multiple antenna elements at multiple points in time or time periods and for one or more RF pulses at the antenna elements;
 said processor being configured to add the single-line cross-correlation matrices into a sum cross-correlation matrix over a summation time period;
 said processor being configured to multiply the sum cross-correlation matrix with a hotspot sensitivity matrix with elements of the hotspot sensitivity matrix respectively representing sensitivities in at least one respective direction at a plurality of hotspot points in the subject;
 said processor being configured to multiply the product of the sum cross-correlation matrix and the hotspot sensitivity matrix with a value representing the dielectricity at at least one hotspot point in order to determine a respective SAR value for each hotspot point; and
 when at least one SAR value exceeds a predetermined upper limit, said processor being configured to reduce or deactivate a voltage applied to at least one of said antenna elements or a current flowing in at least one of said antenna elements.

\* \* \* \* \*